United States Patent
Dai et al.

(10) Patent No.: US 9,728,406 B2
(45) Date of Patent: Aug. 8, 2017

(54) MULTI MATERIALS AND SELECTIVE REMOVAL ENABLED REVERSE TONE PROCESS

(71) Applicant: Applied Materials, Inc., Santa Clara, CA (US)

(72) Inventors: Huixiong Dai, San Jose, CA (US); Christopher S. Ngai, Burlingame, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/818,068

(22) Filed: Aug. 4, 2015

(65) Prior Publication Data
US 2016/0042950 A1 Feb. 11, 2016

Related U.S. Application Data

(60) Provisional application No. 62/035,093, filed on Aug. 8, 2014.

(51) Int. Cl.
*H01L 21/033* (2006.01)
(52) U.S. Cl.
CPC ...... *H01L 21/0337* (2013.01); *H01L 21/0332* (2013.01)
(58) Field of Classification Search
CPC . H01L 21/027; H01L 21/033; H01L 21/0332; H01L 21/0334; H01L 21/0337; H01L 21/0338
See application file for complete search history.

(56) References Cited

U.S. PATENT DOCUMENTS

| 2007/0052133 | A1* | 3/2007 | Gostkowski | ........ H01L 21/0338 264/241 |
| 2008/0239625 | A1 | 10/2008 | Kermarrec et al. | |
| 2009/0020747 | A1* | 1/2009 | Mascolo | ................ B82Y 10/00 257/9 |

(Continued)

FOREIGN PATENT DOCUMENTS

KR 2014-0089690 A 7/2014

OTHER PUBLICATIONS

PCT Notification of Transmittal of the International Search Report and the Written Opinion of the International Searching Authority for International Application No. PCT/US2015/043532 dated Oct. 29, 2015; 9 total pages.

*Primary Examiner* — Scott B Geyer
(74) *Attorney, Agent, or Firm* — Patterson + Sheridan, LLP

(57) ABSTRACT

Embodiments described herein generally relate to methods for device patterning. In various embodiments, a plurality of protrusions and gaps are formed on a substrate, and each gap is formed between adjacent protrusions. Each protrusion includes a first line, a second line and a third line. The first and third lines include a first material, and the second lines include a second material that is different from the first material. A fourth line is deposited in each gap and the fourth line includes a third material that is different than the first and second materials. Because the first, second and third materials are different, one or more lines can be removed by selective etching while adjacent lines that are made of a different material may not be covered by a mask. The critical dimensions (CD) and the edge displacement errors (EPE) of the mask are increased.

20 Claims, 5 Drawing Sheets

(56) References Cited

U.S. PATENT DOCUMENTS

| | | | |
|---|---|---|---|
| 2009/0317644 A1* | 12/2009 | Heller | H01L 21/0271 |
| | | | 428/461 |
| 2010/0025364 A1 | 2/2010 | Pomerene et al. | |
| 2010/0187658 A1 | 7/2010 | Wei | |
| 2014/0077147 A1 | 3/2014 | Tong et al. | |
| 2014/0170853 A1 | 6/2014 | Shamma et al. | |
| 2015/0087149 A1* | 3/2015 | He | H01L 21/0338 |
| | | | 438/696 |

* cited by examiner

MULTI MATERIALS AND SELECTIVE REMOVAL ENABLED REVERSE TONE PROCESS

CROSS-REFERENCE TO RELATED APPLICATIONS

This application claims priority to U.S. Provisional Patent Application Ser. No. 62/035,093, filed on Aug. 8, 2014, which herein is incorporated by reference.

BACKGROUND

Field

Embodiments described herein generally relate to the fabrication of integrated circuits, and more particularly, to methods for device patterning.

Description of the Related Art

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Linewidth is the width of the line and the spacing is the distance between adjacent lines. Pitch is defined as the distance between a same point on two adjacent lines. The pitch is equal to the sum of the linewidth and the spacing. Due to factors such as optics and light or radiation wavelength, however, photolithography techniques have a minimum pitch below which a particular photolithographic technique may not reliably form features. Thus, the minimum pitch of a photolithographic technique can limit feature size reduction.

Processes such as self-aligned double patterning (SADP), self-aligned quad patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE process to perform device patterning. As the feature size decreases, pitch and linewidth also decrease, causing the mask edge placement control to be more complicated and difficult. For example, for a 7 nm node structure, the pitch is about 32 nm, and the cut or block mask's total edge placement errors (EPE) should be less than ¼ of the pitch, which is less than about 8 nm. Equipment capable of meeting such tight geometric requirements are extremely expensive, and additionally, such tight geometric requirements also contribute to low production yields.

Therefore, there is a need for an improved method for device patterning.

SUMMARY

Embodiments described herein generally relate to methods for device patterning. In one embodiment, a method for patterning is disclosed. The method includes placing a substrate into a processing chamber, and depositing a first line on the substrate in each of a plurality of gaps. Each gap is between adjacent protrusions, and each protrusion includes a second line, a third line, and a fourth line. The third line is sandwiched between the second and fourth lines. The first line includes a first material, the second and fourth lines each includes a second material, and the third line includes a third material. The first line is between the fourth line of one protrusion and the second line or an adjacent protrusion.

In another embodiment, a method is disclosed. The method includes placing a substrate into a processing chamber, and selectively removing a first line. The first line includes a first material and is sandwiched between a second line and a third line each includes a second material. The first line, the second line, and the third line are sandwiched between two fourth lines each includes a third material. The first, second, third and fourth lines are formed over the substrate.

In another embodiment, a method is disclosed. The method includes placing a substrate into a processing chamber, and depositing a first line on the substrate in each of a plurality of gaps. Each gap is between adjacent protrusions formed on the substrate, and each protrusion includes a second line, a third line, and a fourth line. The third line is sandwiched between the second and fourth lines. The first line includes a first material, the second and fourth lines each includes a second material, and the third line includes a third material. The first line is between the fourth line of one protrusion and the second line or an adjacent protrusion. The method further includes selectively etching one of the first, second or third materials relative to the other of the materials comprising the lines.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods for device patterning. In various embodiments, a plurality of protrusions and gaps are formed on a substrate, and each gap is formed between adjacent protrusions. Each protrusion includes a first line, a second line and a third line. The first and third lines include a first material, and the second lines include a second material that is different from the first material. A fourth line is deposited in each gap and the fourth line includes a third material that is different than the first and second materials. Because the first, second and third materials are different, one or more lines can be removed by selective etching while adjacent lines that are made of a different material may not be covered by a mask. The critical dimensions (CD) and the EPE of the mask are increased.

Figure 1A:
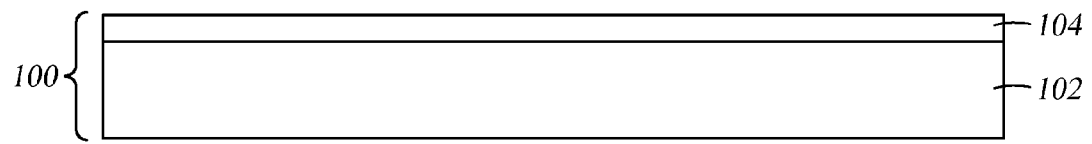
FIGS. 1A-1M illustrate a process for patterning a device according to embodiments described herein.
Figure 1B:
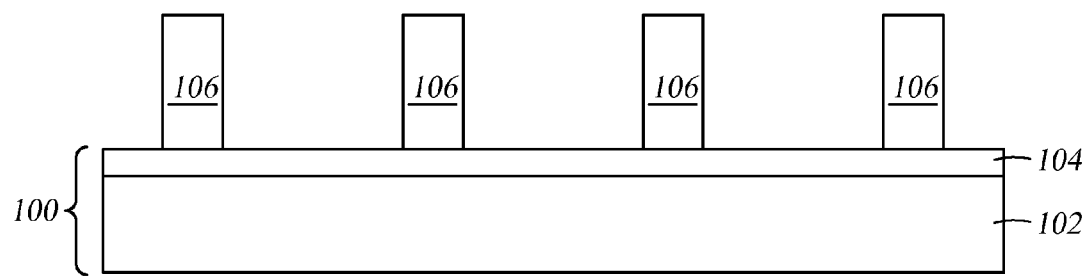

FIGS. 1A-1M illustrate a process for patterning a device according to embodiments described herein. FIG. 1A is a cross sectional side view of a substrate 100 according to one embodiment. The substrate 100 may include a layer 102 and a mask layer 104 disposed on the layer 102. In one embodiment, the layer 102 is a device structure that is to be patterned. In another embodiment, the layer 102 is a bulk silicon layer. The mask layer 104 may be, for example, a SiC layer, a metal layer, a metal nitride layer, a metal oxide layer, a nitride layer, such as TiN or AlN, or an oxide layer. A plurality of first lines 106 may be formed on the mask layer 104, as shown in FIG. 1B. The plurality of first lines 106 may be referred to as placeholders or cores and may have linewidth and/or spacings near the optical resolution of a photolithography system using a high-resolution photomask. The plurality of first lines 106 may be formed by a material such as silicon, amorphous silicon, oxide, nitride, carbon or amorphous carbon. The material may be formed on the mask layer 104 by a chemical vapor deposition (CVD) process or a spin-on process, and then patterned by the photolithography system. The mask layer 104 and the plurality of first lines 106 are formed by two different materials.

Figure 1C:
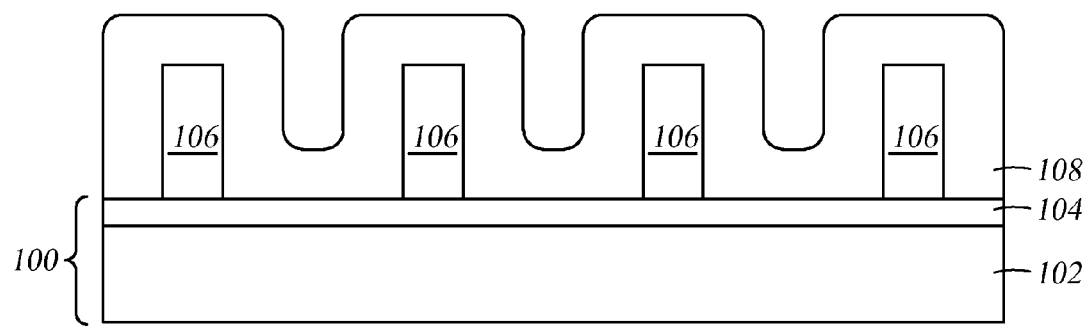
Figure 1D:
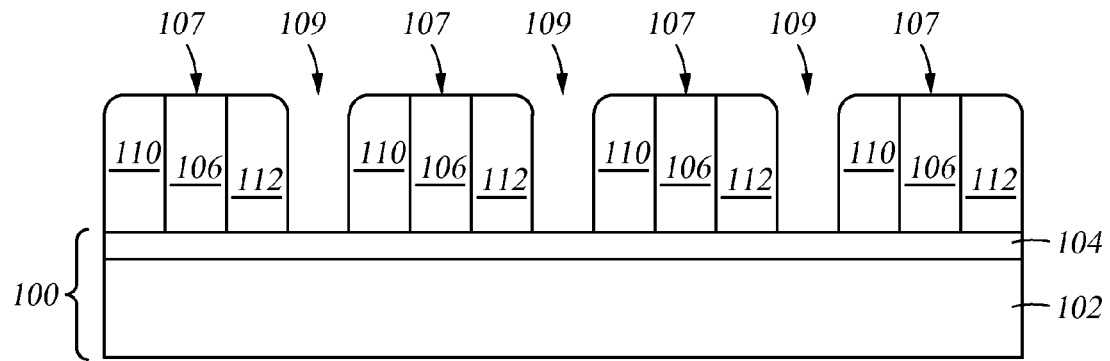

A conformal layer 108 may be formed on the mask layer 104 and the plurality of first lines 106, as shown in FIG. 1C. A plurality of second lines 110 and a plurality of third lines 112 may be formed on the mask layer 104 by preferentially etching the conformal layer 108 with an anisotropic plasma etch to remove the portions of the conformal layer 108 deposited on top of the plurality of first lines and on the mask layer 104, as shown in FIG. 1D. The plurality of second lines 110 and the plurality of third lines 112 may be formed by a material such as nitride formed by atomic layer deposition (ALD), oxide, metal oxide, metal nitride, SiC, silicon, amorphous silicon, or a doped material. The material used for the plurality of second lines 110 and the plurality of third lines 112 is different from the materials used for the mask layer 104 and the plurality of first lines 106. Each first line 106 of the plurality of first lines 106 may be sandwiched between each second line 110 of the plurality of second lines 110 and each third line 112 of the plurality of third lines 112. As shown in FIG. 1D, each first line 106, each second line 110 and each third line 112 form a protrusion 107, and a gap 109 is formed between adjacent protrusions 107.

Figure 1E:
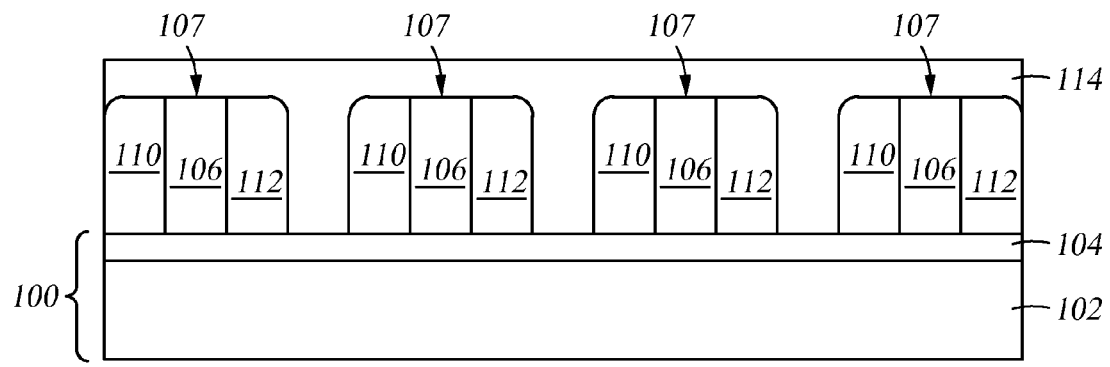
Figure 1F:
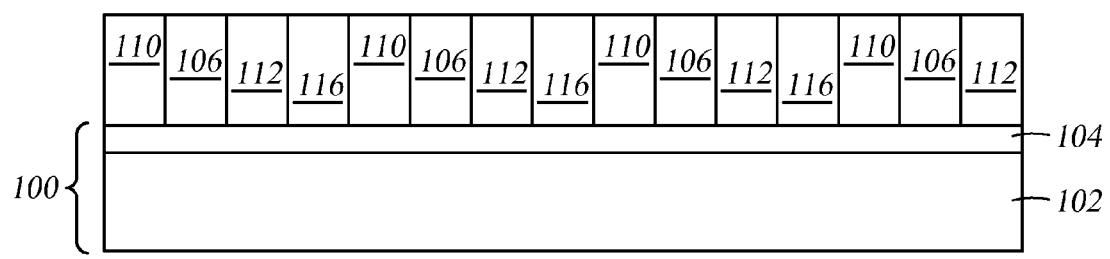

A gap fill 114 may be deposited on the protrusions 107 and on the mask layer 104, as shown in FIG. 1E. The gap fill 114 also may fill the gaps 109. The gap fill 114 may be formed by a material such as oxide formed by flowable CVD, spin-on oxide, nitride, metal oxide, metal nitride, silicon, carbon, SiC, SiN or a doped material. The material used for the gap fill 114 is different from the materials used for the mask layer 104, the plurality of first lines 106, the plurality of second lines 110 and the plurality of third lines 112. Next, a planarization process may be performed and a portion of the gap fill 114 disposed over the protrusions 107 is removed, leaving a plurality of fourth lines 116, as shown in FIG. 1F. Each fourth line 116 is sandwiched between a third line 112 of a protrusion 107 and a second line 110 of an adjacent protrusion 107. After the gap filling process and the planarization process, there are no more protrusions 107 since all the lines 106, 110, 112, 116 are substantially planar. As shown in FIG. 1F, the plurality of first lines 106, the plurality of second lines 110, the plurality of third lines 112, and the plurality of fourth lines 116 may be arranged so that there are three different lines between two first, second, third, or fourth lines. For example, a first line 106 is adjacent to a second line 110, a third line 112 is adjacent to the first line 106, a fourth line 116 is adjacent to the third line 112, a different first line 106 is adjacent to the fourth line 116, and the pattern is repeated. Between the first line 106 and the different first line 106, there are three lines 112, 116, 110.

Figure 1G:
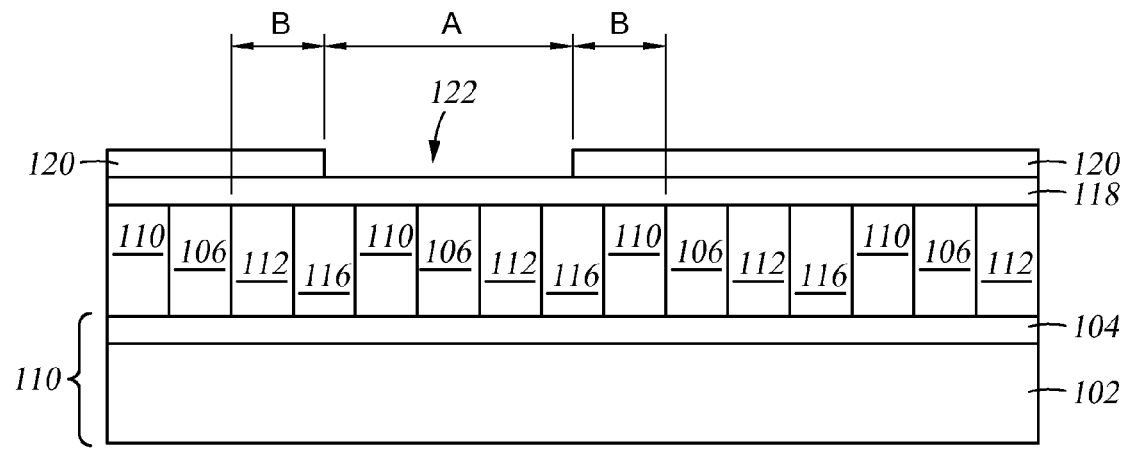
Figure 1H:
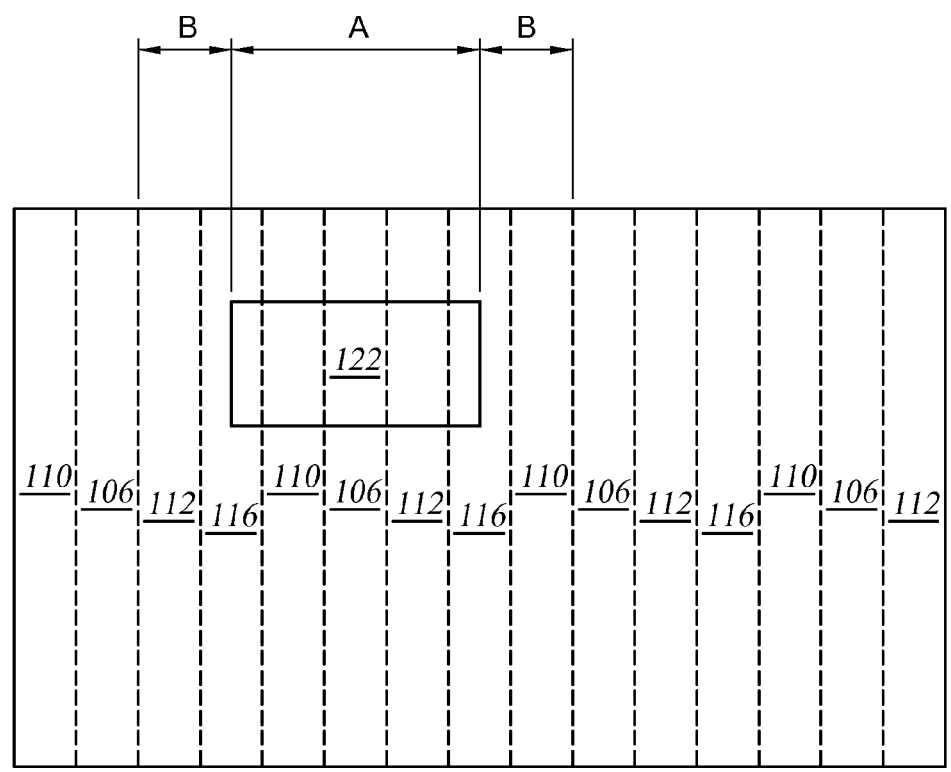

An antireflective layer 118 may be deposited on the plurality of first, second, third and fourth lines 106, 110, 112, 116, and a photoresist 120 having an opening 122 may be formed on the antireflective layer 118, as shown in FIG. 1G. The opening 122 may be formed in order to remove one or more lines that are disposed under an exposed portion of the antireflective layer 118. In one embodiment the line 106 disposed under the exposed portion of the antireflective layer 118 is to be removed. The opening 122 may have a relatively larger CD, indicated by arrows "A," than in a conventional method. The EPE, indicated by arrows "B," may be also greater than that in a conventional method. In one embodiment, as shown in FIG. 1G, the CD plus EPE on both sides of the CD may equal to the distance between a first first line 106 and a second first line 106, and the line 106 that is to be removed is between the first and second first lines 106. Because there are three lines, instead of one line in the conventional method, between the first line 106 and the first first line 106 and between the first line 106 and the second first line 106, the distance between the first first line 106 and the second first line 106 is increased. In turn, the CD of the opening 122 and the EPE of the photoresist 120 can be increased. FIG. 1H is a top view of the structure shown in FIG. 1G. The lines 106, 110, 112, 116 are disposed below the photoresist 120 and the antireflective layer 118, thus are shown in dotted lines. The opening 122 is formed over a portion of one first line 106, and the distance from the edge of the opening 122 to the next first line 106 is the EPE, indicated as "B." Conventionally, the EPE is about half of the linewidth. The EPE "B" shown in FIG. 1H is about one and half of the linewidth, which is three times greater than the convention EPE. By increasing the CD and EPE, the number of photoresists may be reduced, process steps may be simplified, and patterning cost may be reduced.

Figure 1I:
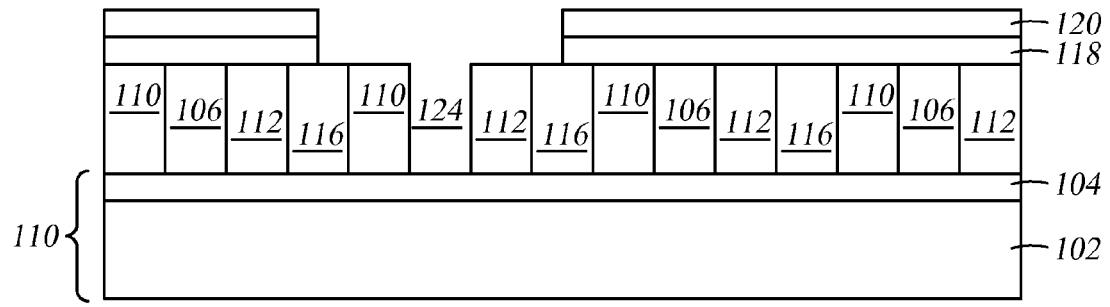

As shown in FIG. 1I, the exposed portion of the antireflective layer 118 and the first line 106 disposed under the exposed portion of the antireflective layer 118 may be removed, forming a gap 124. The exposed portion of the antireflective layer 118 may be removed first by any suitable removal process, exposing a portion of a first fourth line 116, a second line 110, the first line 106, a third line 112 and a portion of a second fourth line 116. A selective etching is performed, and because the first line 106 is made of a material that is different from the second, third and fourth lines 110, 112, 116, the first line 106 may be removed by the selective etching process while the other exposed lines 110, 112, 116 are not affected. The line that is removed may be made of a material that has a faster etch rate than the materials used in other exposed lines for a particular etch chemistry. In one embodiment, the first line 106 is made of a material that has a selectivity ratio of greater than 50 to 1 comparing to the materials used in the second, third and fourth lines 110, 112, 116.

Figure 1J:
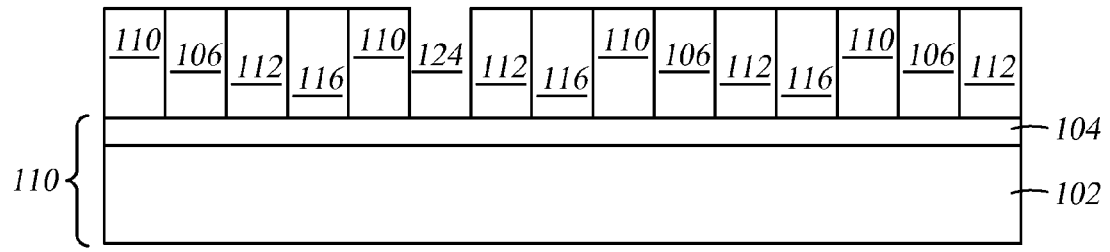
Figure 1K:
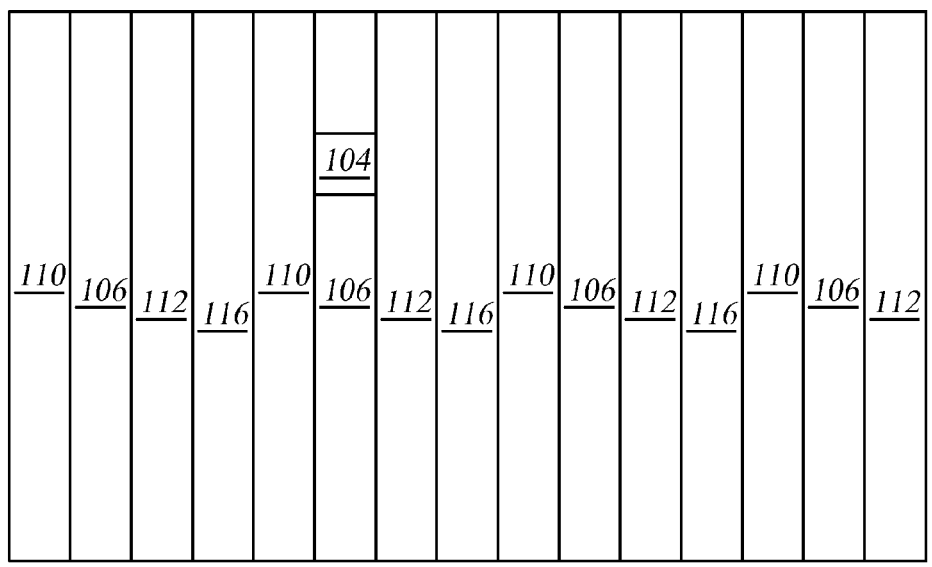
Figure 1L:
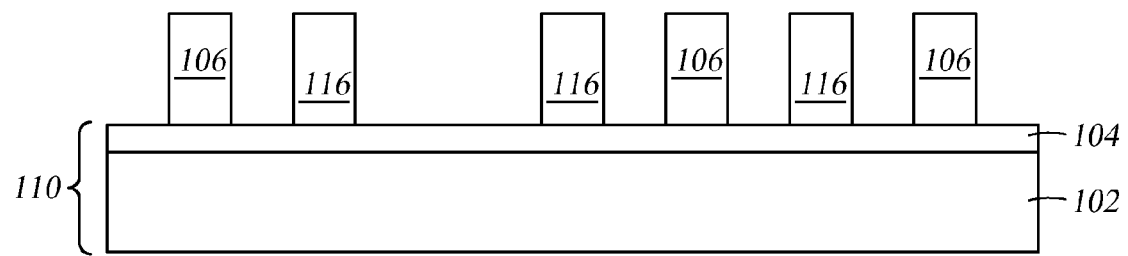
Figure 1M:
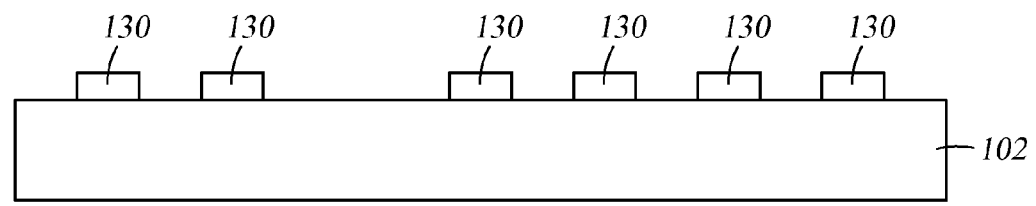

Next, the photoresist 120 and the remaining portion of the antireflective layer 118 may be removed using any suitable removal process, such as ashing, as show in FIG. 1J. FIG. 1K is a top view of the structure showing in FIG. 1J. As shown in FIG. 1K, a portion of the first line 106 is removed, exposing the mask layer 104. FIGS. 1G-1K illustrate an example of removing one line using selective etching. Multiple lines may be removed simultaneously or sequentially using the mask or masks of increased CD and EPE. Since the plurality of second lines and the plurality of third lines may be formed by the same material, it is suggested to remove all second and third lines after other lines have been removed. FIG. 1L shows that all second and third lines 110, 112 have been removed by selective etching. Because the etch chemistry used would etch the second and third lines 110, 112 faster than the first and fourth lines 106, 116, for example, the selectivity ratio is greater than 50 to 1 for the material in the second and third lines 110, 112 compared to the materials in the first and fourth lines 106, 116, all second and third lines 110, 112 are removed while the first and fourth lines 106, 116 are not affected. The remaining first and fourth lines 106, 116, as shown in FIG. 1L, may be used as masks for patterning the mask layer 104. FIG. 1M shows that the pattern of the remaining first and fourth lines 106, 116 may be transferred to the mask layer 104, forming a patterned mask 130. The device structure formed from the layer 102 may be patterned using the patterned mask 130. The process as illustrated in FIGS. 1A-1M may be also used to form conductive lines, interconnects or any suitable structures that may be formed using selective etching.

While the foregoing is directed to embodiments of the disclosure, other and further embodiments may be devised without departing from the basic scope thereof, and the scope thereof is determined by the claims that follow.

The invention claimed is:

1. A method for patterning, comprising:
   placing a substrate into a processing chamber;
   depositing a gap fill on the substrate in each of a plurality of gaps, wherein each gap is between adjacent protrusions formed on the substrate, wherein each protrusion includes a first line having a first line width, a second line having a second line width, and a third line having a third line width, wherein the gap fill has a fourth line width, wherein the second line is sandwiched between the first and third lines, wherein the gap fill comprises a first material, the first and third lines each comprises a second material, and the second line comprises a third material, and wherein the gap fill is between the third line of one protrusion and the first line of an adjacent protrusion;
   depositing a photoresist on the gap fill, first line, second line and third line; and
   forming an opening in the photoresist, wherein the opening has an edge displacement error of one and half times the first linewidth.

2. The method of claim 1, wherein the first material comprises oxide, nitride, metal oxide, metal nitride, silicon, carbon or SiC.

3. The method of claim 2, wherein the second material comprises nitride, oxide, metal nitride, metal oxide, silicon, carbon, SiC, or amorphous silicon, and wherein the second material is different from the first material.

4. The method of claim 3, wherein the third material comprises oxide, nitride, carbon, amorphous carbon, or amorphous silicon, and wherein the third material is different from the first material and the second material.

5. The method of claim 1, wherein the second material comprises nitride, oxide, metal nitride, metal oxide, silicon, carbon, SiC, or amorphous silicon.

6. The method of claim 1, wherein the third material comprises oxide, nitride, carbon, amorphous carbon, or amorphous silicon.

7. A method, comprising:
   placing a substrate into a processing chamber;
   depositing a photoresist on a plurality of first lines, a plurality of second lines, a plurality of third lines and a plurality of fourth lines formed on the substrate, wherein each line of the pluralities of second lines has a linewidth;
   forming an opening in the photoresist, wherein the opening has an edge displacement error of one and half times the linewidth;
   selectively removing a first line of the plurality of first lines through the opening.

8. The method of claim 7, wherein the plurality of first lines comprises a first material comprising oxide, nitride, carbon, amorphous carbon, or amorphous silicon.

9. The method of claim 8, wherein the plurality of second lines and the plurality of third lines comprise a second material comprising nitride, oxide, metal nitride, metal oxide, silicon, carbon, SiC, or amorphous silicon.

10. The method of claim 9, wherein the plurality of fourth lines comprises a third material comprising oxide, nitride, metal oxide, metal nitride, silicon, carbon or SiC.

11. The method of claim 10, wherein the second material comprises nitride, oxide, metal nitride, metal oxide, silicon, carbon, SiC, or amorphous silicon, and wherein the second material is different from the first material.

12. The method of claim 10, wherein the third material comprises oxide, nitride, metal oxide, metal nitride, silicon, carbon or SiC, and wherein the third material is different from the first material and the second material.

13. The method of claim 10, wherein the first material, the second material, and the third material comprise different materials.

14. A method, comprising:
   placing a substrate into a processing chamber;
   depositing a gap fill on the substrate in each of a plurality of gaps, wherein each gap is between adjacent protrusions formed on the substrate, wherein each protrusion includes a first line having a first line width, a second line having a second line width, and a third line having a third line width, wherein the gap fill has a fourth line width, wherein the second line is sandwiched between the first and third lines, wherein the gap fill comprises a first material, the first and third lines each comprises a second material, and the second line comprises a third material, and wherein the gap fill is between the third line of one protrusion and the first line of an adjacent protrusion;
   depositing a photoresist on the gap fill, first line, second line and third line;
   forming an opening in the photoresist, wherein the opening has an edge displacement error of one and half times the first linewidth; and
   selectively etching one of the first, second or third materials relative to the other of the materials comprising the lines.

15. The method of claim 14, wherein the first material comprises oxide, nitride, metal oxide, metal nitride, silicon, carbon or SiC.

16. The method of claim 15, wherein the second material comprises nitride, oxide, metal nitride, metal oxide, silicon, carbon, SiC, or amorphous silicon, and wherein the second material is different from the first material.

17. The method of claim 16, wherein the third material comprises oxide, nitride, carbon, amorphous carbon, or amorphous silicon, and wherein the third material is different from the first material and the second material.

18. The method of claim 14, wherein the second material comprises nitride, oxide, metal nitride, metal oxide, silicon, carbon, SiC, or amorphous silicon.

19. The method of claim 14, wherein the third material comprises oxide, nitride, carbon, amorphous carbon, or amorphous silicon.

20. The method of claim 14, wherein the first material, the second material, and the third material comprise different materials.

* * * * *